United States Patent
Iwashita

(10) Patent No.: US 11,858,851 B2
(45) Date of Patent: Jan. 2, 2024

(54) COMPLEX

(71) Applicant: KYOCERA Corporation, Kyoto (JP)

(72) Inventor: Shuzo Iwashita, Kirishima (JP)

(73) Assignee: Kyocera Corporation, Kyoto (JP)

(*) Notice: Subject to any disclaimer, the term of this patent is extended or adjusted under 35 U.S.C. 154(b) by 418 days.

(21) Appl. No.: 17/258,983

(22) PCT Filed: Jul. 11, 2019

(86) PCT No.: PCT/JP2019/027464
§ 371 (c)(1),
(2) Date: Jan. 8, 2021

(87) PCT Pub. No.: WO2020/013266
PCT Pub. Date: Jan. 16, 2020

(65) Prior Publication Data
US 2021/0309576 A1    Oct. 7, 2021

(30) Foreign Application Priority Data

Jul. 12, 2018 (JP) ................ 2018-132557
Jan. 29, 2019 (JP) ................ 2019-013179

(51) Int. Cl.
| | |
|---|---|
| C04B 35/19 | (2006.01) |
| C04B 35/495 | (2006.01) |
| C04B 35/626 | (2006.01) |
| C04B 35/64 | (2006.01) |
| C30B 29/30 | (2006.01) |
| G02B 5/08 | (2006.01) |

(52) U.S. Cl.
CPC .......... *C04B 35/19* (2013.01); *C04B 35/6262* (2013.01); *C04B 35/62665* (2013.01); *C04B 35/62675* (2013.01); *C04B 35/64* (2013.01); *C30B 29/30* (2013.01); *C04B 2235/3255* (2013.01); *C04B 2235/3472* (2013.01); *C04B 2235/5436* (2013.01); *C04B 2235/5445* (2013.01); *C04B 2235/6567* (2013.01); *C04B 2235/77* (2013.01); *C04B 2235/9607* (2013.01); *G02B 5/0808* (2013.01)

(58) Field of Classification Search
None
See application file for complete search history.

(56) References Cited

U.S. PATENT DOCUMENTS 10,807,905 B2 * 10/2020 Hirose ............... C03C 8/24
10,913,686 B2 * 2/2021 Hirose ............... C03C 14/00
2003/0125184 A1 7/2003 Mitra
(Continued)

FOREIGN PATENT DOCUMENTS

| JP | 2003-267789 A | 9/2003 |
| JP | 2004-269272 A | 9/2004 |

*Primary Examiner* — Karl E Group
(74) *Attorney, Agent, or Firm* — Procopio, Cory, Hargreaves & Savitch LLP

(57) ABSTRACT

A complex according to the present disclosure contains a β-eucryptite crystal phase and a lithium tantalate crystal phase. In a temperature range of 0 to 50° C., a coefficient of thermal expansion calculated for each 1° C. is within 0±1 ppm/K. Calcium is contained in the lithium tantalate crystal phase. The volume ratio of the β-eucryptite crystal phase to the lithium tantalate crystal phase is from 90:10 to 99.5:0.5.

17 Claims, 1 Drawing Sheet

(56) References Cited

U.S. PATENT DOCUMENTS

2012/0107585 A1* 5/2012 Blanchard ............. C04B 35/117
501/153
2019/0127266 A1* 5/2019 Hirose .................... C03C 8/24
2019/0225547 A1* 7/2019 Hirose ................. C04B 35/117

* cited by examiner

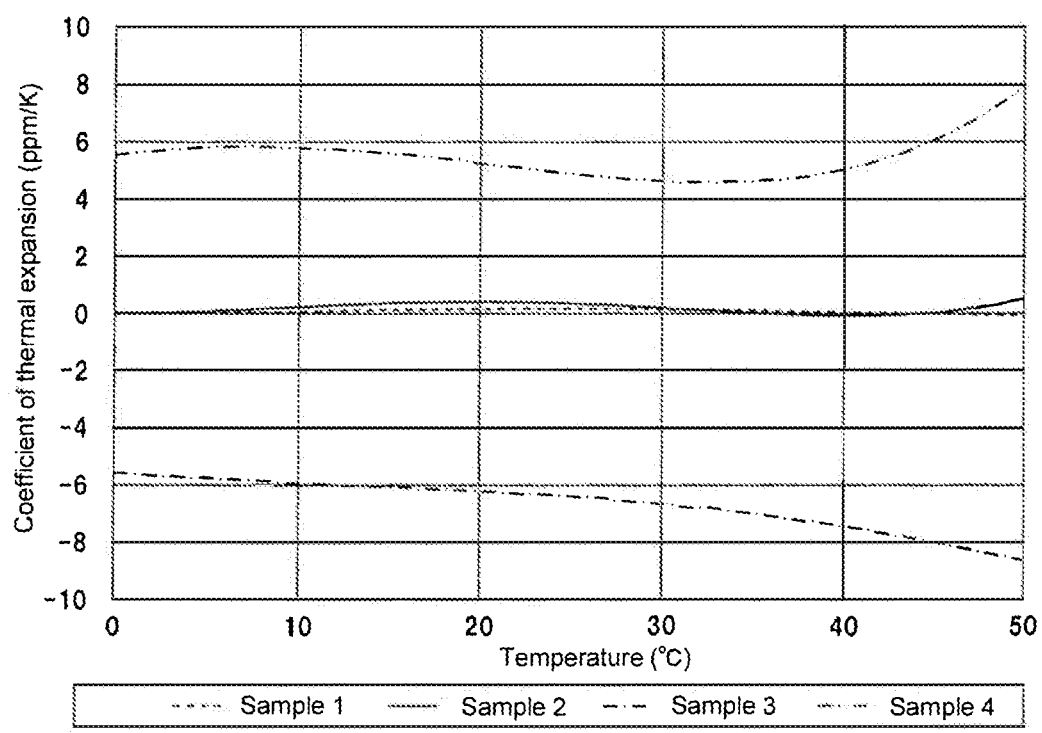

COMPLEX

TECHNICAL FIELD

The present disclosure relates to a complex and lithium tantalate.

BACKGROUND ART

As a member having excellent low thermal expansion properties, low thermal expansion glass, which is a complex of β-eucryptite and glass, is known (see, for example, Patent Document 1).

RELATED ART DOCUMENT

Patent Document

Patent Document 1: Japanese Unexamined Patent Publication No. 2003-267789

SUMMARY OF THE INVENTION

The complex of the present disclosure contains a β-eucryptite crystal phase and a lithium tantalate crystal phase.

BRIEF DESCRIPTION OF THE DRAWINGS

FIG. 1 is a graph showing the measurement results of the coefficient of thermal expansion in Examples.

EMBODIMENTS FOR CARRYING OUT THE INVENTION

<Complex>

Hereinafter, the complex according to one embodiment of the present disclosure will be described in detail.

The complex of the present embodiment contains a β-eucryptite ($LiAlSiO_4$) crystal phase and a lithium tantalate ($LiTaO_3$) crystal phase.

β-eucryptite exhibits negative thermal expansion behavior, and lithium tantalate exhibits positive thermal expansion behavior. Since the complex contains the crystal phases of β-eucryptite and lithium tantalate that exhibit such thermal expansion behaviors, it is possible to exhibit low thermal expansion properties. In addition, the complex having the above-mentioned configuration may contain 90% by volume or more, or further 99% by volume or more of the total of the β-eucryptite crystal phase and the lithium tantalate crystal phase. In the complex, β-eucryptite and lithium tantalate each maintain their pre-complex, crystal states, and when made complex, another product (crystal phase or glass phase) other than the crystal phases of β-eucryptite and lithium tantalate is not substantially generated, and therefore, there is no effect on the thermal expansion behavior by another product, and the thermal expansion behavior of the entire complex can be accurately controlled. Therefore, the complex of the present embodiment can exhibit low thermal expansion properties over a wide temperature range. The complex may contain other compositions that do not react with β-eucryptite or lithium tantalate.

The complex can also exhibit high rigidity due to the lithium tantalate crystal phase. In addition, it can be said that the complex of the present embodiment does not contain a crystal phase or a glass phase other than the β-eucryptite crystal phase and the lithium tantalate crystal phase.

The respective crystal phases of β-eucryptite and lithium tantalate can be confirmed by, for example, X-ray Diffraction (hereinafter, referred to as "XRD" in some cases). It can also be confirmed by XRD that the complex does not contain a crystal phase or a glass phase other than the β-eucryptite crystal phase and the lithium tantalate crystal phase.

As a raw material to be made complex with β-eucryptite, other raw materials showing positive thermal expansion behavior can be considered, but when the raw material is made complex, a by-product of a crystal phase or a glass phase other than the raw material is generated. For example, when β-eucryptite is made complex with alumina or zirconia to prepare a low thermal expansion complex, the mass ratio of the β-eucryptite and such raw material is about 1:1 or it is necessary to further increase the amount of such raw material. The bulk density of such a complex greatly exceeds 3 $g/cm^3$. In addition, it is difficult to produce such a complex having stable characteristics because the amount and state of production of by-products may vary due to variations in the manufacturing process and the like.

Low thermal expansion properties mean that the thermal expansion is close to zero and deformation due to temperature change is small. The temperature range in which the complex can exhibit low thermal expansion properties is, for example, from 0 to 50° C.

In the temperature range of 0 to 50° C., the coefficient of (linear) thermal expansion calculated for each 1° C. may be within 0±1 ppm/K. When such a configuration is satisfied, the complex can exhibit low thermal expansion properties over a wide temperature range. The coefficient of thermal expansion is, for example, a value measured in accordance with JIS R 1618:1994. The coefficient of (linear) thermal expansion calculated for each 1° C. in the temperature range of 0 to 50° C. means that a coefficient of (linear) thermal expansion at 0 to 1° C., a coefficient of (linear) thermal expansion at 1 to 2° C., . . . and a coefficient of (linear) thermal expansion at 49 to 50° C. have been calculated. Hereinafter, the unit of the coefficient of thermal expansion is expressed as ppm/K or ppb/K, and 1 ppm/K is $1\times10^{-6}$/K and 1 ppb/K is $1\times10^{-9}$/K.

The low thermal expansion material containing cordierite as a main component exhibits negative thermal expansion behavior below a certain temperature and positive thermal expansion behavior at a temperature higher than that temperature. In other words, the coefficient of thermal expansion can be brought close to 0 only in a very narrow temperature range. In some documents, it may be stated that the coefficient of thermal expansion in the predetermined temperature range can be reduced, but only the coefficient of thermal expansion calculated from the difference between the two temperatures of the minimum temperature and the maximum temperature in the predetermined temperature range is small. Therefore, it is unlikely that the coefficient of thermal expansion calculated for each 1° C. in the predetermined temperature range is small. In particular, it seems unlikely that, in the temperature range of 0 to 50° C., the coefficient of (linear) thermal expansion calculated for each 1° C. is set within 0±1 ppm/K, and further within 0±0.5 ppm/K.

The complex may have a bulk density of 3 $g/cm^3$ or less. The complex may further have a bulk density of 2.55 $g/cm^3$ or less. When such a configuration is satisfied, the weight of the complex can be reduced. The lower limit of the bulk density may be 2.34 $g/cm^3$. The bulk density is, for example, a value measured in accordance with JIS R 1634-1998. A typical low thermal expansion glass has a bulk density of about 2.53 $g/cm^3$.

A complex having a bulk density of 3 g/cm³ can be prepared, for example, from a raw material having a mass ratio of lithium tantalate to β-eucryptite of 28.6 to 71.4. Such a complex contains 12% by volume of lithium tantalate and 88% by volume of β-eucryptite, and exhibits low thermal expansion properties with a coefficient of (linear) thermal expansion of 30 ppm/K. It is desirable that the members used for optical components are lightweight. In particular, members mounted on objects launched from the ground into space, such as artificial satellites, are desired to be lightweight, instead of limiting the mass that can be launched and reducing the launch cost. Therefore, a material having a low material density and high rigidity can be reduced in weight. A large configuration proportion of β-eucryptite is preferable because it enables a reduction in density.

Further, a complex having a bulk density of 2.55 g/cm³ can be prepared, for example, from a raw material having a mass ratio of lithium tantalate to β-eucryptite of 28.6 to 71.4. Such a complex contains 12% by volume of lithium tantalate and 88% by volume of β-eucryptite, and exhibits low thermal expansion properties with a coefficient of (linear) thermal expansion of 30 ppm/K. A complex containing 10% by volume of lithium tantalate and 90% by volume of β-eucryptite exhibits low thermal expansion properties with a coefficient of (linear) thermal expansion of 30 ppm/K. The coefficient of (linear) thermal expansion at 22° C. can be reduced to about 50 ppm/K, and the bulk density can be reduced to about 2.43 g/cm³.

The Young's modulus of the complex may be 100 GPa or more. When such a configuration is satisfied, the rigidity of the complex is increased. The Young's modulus is improved by dispersing fine particles of lithium tantalate, which has a higher hardness than β-eucryptite, in a sintered body. In the absence of lithium tantalate, a glass phase is formed at the grain boundary and the Young's modulus decreases. The upper limit of the Young's modulus may be 123 GPa or 120 GPa. The Young's modulus is, for example, a value measured using a nanoindenter method. A typical low thermal expansion glass has a Young's modulus of about 90 GPa.

The complex may have a specific rigidity of, for example, 33 or more. The complex may further have a specific rigidity of 39 or more. When such a configuration is satisfied, the rigidity of the complex is increased. The upper limit of the specific rigidity may be 51. The specific rigidity is, for example, a value calculated from the formula: Young's modulus/bulk density. A typical low thermal expansion glass has a specific rigidity of about 36.

The complex may have a thermal conductivity of, for example, 2 W/mK or more. When such a configuration is satisfied, the thermal conductivity of the complex is increased, so that it is suitable as a fixing member for applications requiring heat dissipation property, such as the primary mirror of an astronomical telescope. The upper limit of the thermal conductivity may be 3.5 W/mK. The thermal conductivity is, for example, a value measured in accordance with JIS R 1611:2010. A typical low thermal expansion glass has a thermal conductivity of about 1.5 W/mK.

The average particle size of the lithium tantalate crystal phase may be larger than the average particle size of the β-eucryptite crystal phase. When such a configuration is satisfied, the bending strength of the complex can be improved.

The lithium tantalate crystal phase may have an average particle size of 4 μm or less, or 3 μm or less. The lower limit of the average particle size of the lithium tantalate crystal phase may be 0.7 μm or 1 μm. The particle size is related to the bending strength of the complex, and a small particle size has the effect of improving the bending strength. Therefore, it is preferable that the particle size of the crystal phase is small.

For the same reason, the β-eucryptite crystal phase may have an average particle size of 5 μm or less, or 2 μm or less. The lower limit of the average particle size of the β-eucryptite crystal phase may be 0.7 μm or 1 μm. The average particle size is a value obtained by observing a cross section of the complex using, for example, a scanning electron microscope (hereinafter, referred to as "SEM" in some cases).

The average particle size of a crystal phase having the β-eucryptite crystal phase and the lithium tantalate crystal phase combined may be 2 μm or less. The lower limit of the average particle size of the crystal phase may be 1 μm. The particle size is related to the bending strength of the complex, and a small particle size has the effect of improving the bending strength. Therefore, it is preferable that the particle size of the crystal phase is small.

The percent by volume of the β-eucryptite crystal phase may be larger than the percent by volume of the lithium tantalate crystal phase. When such a configuration is satisfied, the proportion of β-eucryptite, which is lighter than lithium tantalate, is relatively large, so that the weight of the complex can be reduced. The volume ratio (volume proportion) of the β-eucryptite crystal phase to the lithium tantalate crystal phase may be from 90:10 to 99:1 or from 90:10 to 99.5:0.5. The volume ratio (percent by volume) is a value obtained by observing a cross section of the complex using, for example, SEM. When the volume ratio is as described above, the value of the coefficient of thermal expansion of the complex can be brought close to 0. Specifically, the coefficient of (linear) thermal expansion at 22° C. can be in the range of −500 ppb/K to 1000 ppb/K. Furthermore, by setting the above-mentioned volume ratio to 95:5 to 99:1, the coefficient of (linear) thermal expansion at 22° C. can be set within the range of −50 ppb/K to 50 ppb/K.

The complex may have a relative magnetic permeability of 1.001 or less, or 1 or less. When such a configuration is satisfied, the complex becomes substantially non-magnetic, so that it is suitable as a member for applications requiring non-magnetism. The lower limit of the relative magnetic permeability may be 0.999. The relative magnetic permeability is a value measured using, for example, a vibrating sample magnetometer.

The preferred range of the relative magnetic permeability is within 1±0.001. The complex is desired to be non-magnetic for application to, for example, members that may move in strong magnetic fields (e.g., components of artificial satellites) and members used in devices that use electron beams. In such cases, the relative magnetic permeability is required to be 1.001 or less. It has been found that the effect on the electron beam is significantly adversely affected when the relative magnetic permeability exceeds 1.001, and therefore, the relative magnetic permeability is desired to be 1.001 or less. The relative magnetic permeability is smaller than 1 in the case of a substance having diamagnetism, and is calculated to be smaller than 1.

It has been found that β-eucryptite has a relative magnetic permeability of about 0.9999. When lithium tantalate to be made complex has an appropriate relative magnetic permeability, the relative magnetic permeability of the complex can fall within the above range. As a result of evaluation, typical commercially available lithium tantalate has a relative magnetic permeability of 1.2, and when the lithium tantalate is made into a complex, the complex may have a relative magnetic permeability of 1.001 or more, which is not preferable as members that may operate in strong magnetic fields and as members in devices that use electron beams. In a case where a test such as high-speed rotation (8000 Hz) in a magnetic field of 9.4 Tesla has been conducted, a behavior of a sample becoming eccentric in the container has been confirmed in the above-mentioned lithium tantalate powder, and a strong effect on the magnetic field has been confirmed. On the other hand, for example, lithium tantalate powder prepared by performing a heating/melting reaction treatment using lithium carbonate and tantalum pentoxide, having a purity of 99.9% or more, has a relative magnetic permeability of 1.001 or less, and even if the lithium tantalate powder is made into a complex with β-eucryptite at the above-mentioned ratio, the complex can have a relative magnetic permeability of 1.001 or less. It has been found that such lithium tantalate powder does not show eccentricity even when rotated at high speed (8000 Hz) in the above-mentioned magnetic field of 9.4 Tesla, and is not affected by the magnetic field. It has further been found that when complex of a lithium tantalate crystal phase and a β-eucryptite crystal phase at a ratio (volume ratio) of 0.12:0.88 is prepared using lithium tantalate having a relative magnetic permeability of 1.009, the complex has a relative magnetic permeability of 1.001.

The complex may have a bending strength of, for example, 70 MPa or more, 110 MPa or more, or 150 MPa or more. When such a configuration is satisfied, the rigidity of the complex is high. The upper limit of the bending strength may be 170 MPa. The bending strength is, for example, a value measured in accordance with JIS R 1601:2008.

The water absorption rate of the complex may be, for example, 0.1% or less. When such a configuration is satisfied, the complex can be densified. The water absorption rate is, for example, a value measured using the Archimedes method.

The complex may be for optical members. Specific examples thereof include, for example, a fixed member such as a primary mirror of an astronomical telescope or a mirror mounted on an artificial satellite. The application of the complex is not limited to the optical member.

<Method for Producing Complex>

Next, a method for producing a complex according to the embodiment for the present disclosure will be described.

In the present embodiment, first, crystals of β-eucryptite and lithium tantalate are mixed to obtain a mixture. At this time, in the obtained complex, the crystals may be mixed at a ratio such that the crystal phases of β-eucryptite and lithium tantalate each have a mass ratio of 70:30 to 99:1. As β-eucryptite (LiAlSiO$_4$), a commercially available powder may be used, or lithium carbonate, Al$_2$O$_3$, and SiO$_2$ may be mixed at a predetermined ratio and heat-synthesized.

The mixture is then sintered to give a complex. The sintering conditions may be set as follows, for example. The sintering temperature may be from 1050° C. to 1150° C. When the sintering temperature is set to 1150° C. or lower, the particle size can be controlled and densified. The keep time may be from 1 to 10 hours.

<Lithium Tantalate>

Next, lithium tantalate according to an embodiment of the present disclosure will be described.

The lithium tantalate of the present embodiment has a relative magnetic permeability of 1.009 or less. Such lithium tantalate is suitable as a raw material for the above-mentioned complex. The lithium tantalate of the present embodiment may be used when the relative magnetic permeability of the complex is 1.001 or less. The lower limit of the relative magnetic permeability may be 0.993.

Further, the lithium tantalate having the above-mentioned relative magnetic permeability can be used for other applications. For example, single-crystal lithium tantalate having the above-mentioned relative magnetic permeability can be used in a surface acoustic wave device. Such a surface acoustic wave device can reduce variations in characteristics in a magnetic field. Further, as such lithium tantalate, one having a relative magnetic permeability of 1.1 or less can be used. The lower limit of the relative magnetic permeability of such lithium tantalate may be 0.9.

<Method for Producing Lithium Tantalate>

Next, a method for producing lithium tantalate according to the embodiment of the present disclosure will be described.

First, lithium carbonate and tantalum pentoxide, having a purity of 99.9% by mass or more, are used to perform dry mixing and pulverization, and then heated and melted at 1000° C. or higher in a crucible to synthesize lithium tantalate.

Then, the lithium tantalate is subjected to heat treatment in coexistence with potassium hydrogen carbonate (KHCO$_3$) or a mixture of potassium hydrogen carbonate and at least one powder of transition metal elements such as Ti, Fe, Al, Ni, and Zn in a temperature range equal to or lower than the Curie temperature of lithium tantalate from 550° C. under a nitrogen atmosphere to thereby obtain the lithium tantalate of the present embodiment.

The transition metal element to be combined with KHCO$_3$ is not particularly limited, but Ti and Fe are preferable, and Ti and Fe may be used.

The potassium hydrogen carbonate and the transition metal element are mixed, for example, in a ratio such that the amount of the potassium hydrogen carbonate is from 5 to 15 parts by mass with respect to 100 parts by mass of the lithium tantalate, and the amount of the transition metal element is from 1 to 10 parts by mass with respect to 100 parts by mass of the potassium hydrogen carbonate.

The conventional lithium tantalate without the above-mentioned treatment has a relative magnetic permeability of 1.2, and it is considered that this relative magnetic permeability is expressed by the presence of lithium pores. In the lithium tantalate of the present embodiment to be subjected to the above-mentioned treatment, the lithium pores are reduced by forming a K solid solution in the lithium pores existing in the conventional lithium tantalate, and the relative magnetic permeability is reduced to 1.1 or less, and further 1.009 or less.

Next, a complex according to another embodiment of the present disclosure will be described in detail. The complex according to another embodiment contains a β-eucryptite (LiAlSiO$_4$) crystal phase and a lithium tantalate (LiTaO$_3$) crystal phase, and the lithium tantalate crystal phase contains calcium (Ca).

When calcium is contained in the lithium tantalate crystal phase, the range in which the coefficient of thermal expansion of the complex varies with temperature change can be narrowed. As a result, the value of the coefficient of thermal expansion can also be brought close to 0 (zero). As the reason for this, the following reasons can be presumed.

A comparison of β-eucryptite and lithium tantalate on the effect of the coefficient of thermal expansion of the complex on the temperature dependence (the range in which the coefficient of thermal expansion varies with temperature changes from 15° C. to 40° C.) shows that the effect of lithium tantalate is greater than that of β-eucryptite. Therefore, when the temperature dependence of the coefficient of thermal expansion of lithium tantalate is reduced, the temperature dependence of the coefficient of thermal expansion of the complex can also be reduced. When calcium is contained in the lithium tantalate crystal phase, the temperature dependence of the coefficient of thermal expansion of lithium tantalate can be reduced due to the substitution of lithium in the lithium tantalate with calcium. Therefore, when calcium is contained in the lithium tantalate crystal phase, the temperature dependence of the coefficient of thermal expansion of lithium tantalate can be reduced, and accordingly, the temperature dependence of the coefficient of thermal expansion of the complex can also be reduced. As a result, the range in which the coefficient of thermal expansion of the complex varies with temperature change can be narrowed, and the value of the coefficient of thermal expansion can also be brought close to 0. Combined with these effects, the complex can exhibit low thermal expansion characteristics over a wide temperature range. The complex can also exhibit high rigidity due to the lithium tantalate crystal phase.

When the lithium tantalate is represented by the composition formula $(Li_{1-x}Ca_{x/2})TaO_3$, a relationship of $0<x\leq0.2$ may be satisfied. In the composition formula, x indicates the amount of calcium substituted. As x increases from 0 to 0.1, the temperature dependence of the coefficient of thermal expansion (from 15° C. to 40° C.) can be reduced. Moreover, the temperature dependence tends to slightly increase when x increases from 0.1 to 0.2, but becomes smaller than that when x is 0. By setting x to 0.05 or more, the temperature dependence of the coefficient of thermal expansion can be reduced. The composition of lithium tantalate represented by the composition formula described above can be measured, for example, by ICP (Inductively Coupled Plasma) emission spectroscopy.

Calcium up to about x=0.1 is dissolved in the lithium tantalate crystal phase. Lithium tantalate at x=0 to 0.1 is composed substantially only of the lithium tantalate crystal phase. Lithium tantalate with x greater than 0.1 is presumed to be composed of a lithium tantalate crystal phase with about x=0.1 and excess calcium component. Therefore, the lithium tantalate of the present embodiment may contain excess calcium component, and it can be said that the lithium tantalate crystal phase of the present embodiment does not contain excess calcium component. The excess calcium component is considered to exist outside the crystal phase, but is not directly observed.

In the complex according to another embodiment, 2θ of a diffraction peak of a (006) plane in the lithium tantalate crystal phase may be 39.25° or higher. The diffraction peak of the (006) plane is shifted to the higher angle side due to the calcium substitution. This indicates that the c-axis lattice constant is contracted by the calcium solid solution. In the above-mentioned composition formula, a relationship of 2θ≥39.25° corresponds to a relationship of x≥0.05. Further, 2θ=39.18° corresponds to x=0. Therefore, the value of 2θ indicates the content of calcium in the lithium tantalate crystal phase. 2θ may be 39.33° or less. 2θ is, for example, a value obtained by measuring by XRD.

In the complex according to another embodiment, the change width of the coefficient of (linear) thermal expansion calculated for each 1° C. in the temperature range of 15° C. to 40° C. may be 50 ppb/K or less. Further, in the temperature range of 0° C. to 50° C., the change width of the coefficient of (linear) thermal expansion calculated for each 1° C. may be 100 ppb/K or less. The coefficient of (linear) thermal expansion at 22° C. may be from −500 ppb/K to 1000 ppb/K. The coefficient of (linear) thermal expansion is a value measured in accordance with JIS R 1618:1994, for example. The change width of the coefficient of thermal expansion calculated for each 1° C. in the temperature range of 15° C. to 40° C. is a value obtained by calculating a coefficient of thermal expansion of 15° C. to 16° C., a coefficient of thermal expansion of 16° C. to 17° C., . . . , and a coefficient of thermal expansion of 39° C. to 40° C., selecting the maximum value and the minimum value from the calculated coefficients of thermal expansion, and applying them to the formula: maximum value-minimum value. This point is the same as in the change width of the coefficient of thermal expansion calculated for each 1° C. in the temperature range of 0° C. to 50° C.

<Method for Producing Complex>

Next, a method for producing a complex according to another embodiment of the present disclosure will be described.

First, a β-eucryptite crystal and a lithium tantalate crystal, which are raw materials, are prepared. As the β-eucryptite crystal, in the same manner as above, a commercially available powder may be used, or one in which lithium carbonate, $Al_2O_3$, and $SiO_2$ are mixed at a predetermined ratio and heat-synthesized may be used.

As the lithium tantalate crystal, one in which lithium is substituted with calcium is used. As such lithium tantalate crystal, for example, one in which calcium carbonate is mixed with lithium carbonate and tantalum pentoxide at a predetermined ratio and heat-synthesized may be used. This point will be described in detail in the method for producing lithium tantalate, which will be described later.

Next, the crystals of β-eucryptite and lithium tantalate are mixed to give a mixture. At this time, in the obtained complex, the crystals may be mixed at a ratio such that the crystal phases of β-eucryptite and lithium tantalate each have a mass ratio of 70:30 to 99:1.

Then, the above-mentioned mixture is sintered to give a complex. The sintering conditions may be set as follows, for example. The sintering temperature may be from 1050° C. to 1250° C., or may be from 1050° C. to 1150° C. The keep time may be from 1 to 10 hours.

<Lithium Tantalate>

Next, lithium tantalate according to another embodiment of the present disclosure will be described.

When the lithium tantalate according to another embodiment is represented by the composition formula $(Li_{1-x}Ca_{x/2})TaO_3$, a relationship of $0<x\leq0.2$ is satisfied. Such lithium tantalate is suitable as a raw material for the above-mentioned complex. When single-crystal lithium tantalate is used, the lithium tantalate may satisfy a relationship of $0<x\leq0.1$, which does not form the excess calcium component described above.

Lithium tantalate may have a relative magnetic permeability of 1.009 or less. Such lithium tantalate is suitable as a raw material when the relative magnetic permeability of the complex is 1.001 or less. The lower limit of the relative magnetic permeability may be 0.993.

Further, the lithium tantalate represented by the above-mentioned composition formula can be used for other applications. For example, single-crystal lithium tantalate represented by the above-mentioned composition formula can be used in a surface acoustic wave device. Such a surface acoustic wave device can reduce variations in characteristics in a magnetic field. Further, as such lithium tantalate, one having a relative magnetic permeability of 1.1 or less can be used. The lower limit of the relative magnetic permeability of such lithium tantalate may be 0.9.

<Method for Producing Lithium Tantalate>

Next, a method for producing lithium tantalate according to another embodiment of the present disclosure will be described.

For example, when lithium carbonate, tantalum pentoxide, and calcium carbonate, having a purity of 99.9% by mass or more, are used to perform dry mixing and pulverization, and then heated and melted at 1000° C. or higher in a crucible, lithium tantalate represented by the above-mentioned composition formula can be synthesized.

The ratio of the calcium carbonate may be set so as to satisfy a relationship of $0<x\leq0.2$ in the above-mentioned composition formula. Specifically, the amount of the calcium carbonate may be 1 mol or less with respect to 4 mol of the lithium carbonate.

The obtained lithium tantalate may be subjected to heat treatment in coexistence with potassium hydrogen carbonate ($KHCO_3$) or a mixture of potassium hydrogen carbonate and at least one powder of transition metal elements such as Ti, Fe, Al, Ni, and Zn in a temperature range equal to or lower than the Curie temperature of lithium tantalate from 550° C. under a nitrogen atmosphere. The heat treatment time may be set to 1 to 10 hours. The transition metal element to be combined with $KHCO_3$ is not particularly limited, but Ti and Fe are preferable, and Ti and Fe may be used.

The amount of the potassium hydrogen carbonate and the transition metal element may be set, for example, such that the amount of the potassium hydrogen carbonate is from 5 to 15 parts by mass with respect to 100 parts by mass of the lithium tantalate, and the amount of the transition metal element is from 1 to 10 parts by mass with respect to 100 parts by mass of the potassium hydrogen carbonate.

The lithium tantalate without the above-mentioned heat treatment has a relative magnetic permeability of 1.2, and it is considered that this relative magnetic permeability is expressed by the presence of lithium pores. In the lithium tantalate to be subjected to the above-mentioned heat treatment, the lithium pores are reduced by forming a K solid solution in the lithium pores existing in the lithium tantalate, and the relative magnetic permeability is reduced to 1.1 or less, and further 1.009 or less.

Hereinafter, the present disclosure will be described in detail with reference to examples, but the present disclosure is not limited to the following examples.

EXAMPLES

[Samples 1 and 2]
<Preparation of Complex>

A crystal of lithium tantalate having a relative magnetic permeability of 1.00001 was prepared. Specifically, first, lithium carbonate and tantalum pentoxide, having a purity of 99.9% by mass or more, were used to perform dry mixing and pulverization, and then heated and melted at 1670° C. in an iridium crucible to synthesize lithium tantalate. Then, the lithium tantalate was pulverized to obtain a crystal powder of lithium tantalate having an average particle size ($D_{50}$) of 1.5 μm.

Then, the obtained lithium tantalate was subjected to heat treatment in coexistence with a mixture of potassium hydrogen carbonate and a powder of Ti and Fe as transition metal elements at 550° C. for 3 hours in a nitrogen atmosphere to thereby obtain lithium tantalate having a relative magnetic permeability of 1.00001. The potassium hydrogen carbonate and the transition metal element were mixed in a ratio such that the amount of the potassium hydrogen carbonate was 10 parts by mass with respect to 100 parts by mass of the lithium tantalate, and the amount of the transition metal element was 5 parts by mass with respect to 100 parts by mass of the potassium hydrogen carbonate.

A complex was prepared using the crystal of lithium tantalate obtained as described above. Specifically, crystals of β-eucryptite having an average particle size ($D_{50}$) of 0.9 μm and lithium tantalate were mixed to give a mixture. At this time, in the obtained complex, the crystals were mixed at a ratio such that the crystal phases of β-eucryptite and lithium tantalate each had the mass ratio shown in Table 1.

Then, the mixture was sintered to give complexes of samples 1 and 2 shown in Table 1. The sintering conditions are as follows. Such sintering conditions cause grain growth in the crystals of β-eucryptite and lithium tantalate to have the average particle size to be shown later.

Sintering temperature: 1150° C.
Keep time: 3 hours

The obtained complex was measured by XRD. The XRD measurement conditions are as follows.

Analyzer: "X'Pert PRO-MRD" manufactured by PANalytical
Bulb: CuKα
Slit width: 0.5°
Measurement range: 2θ=10 to 80°

From the measurement results by XRD, the crystal phases of β-eucryptite and lithium tantalate were confirmed in the obtained complex. It was also confirmed that the complex did not contain a crystal phase or a glass phase other than the β-eucryptite crystal phase and the lithium tantalate crystal phase. The fact that no crystal phase other than the above-mentioned two crystal phases is contained means that when the diffraction peak having a peak intensity of more than 3 times the background intensity of XRD is set as a dominant peak, there is no peak except those of lithium tantalate and β-eucryptite. In addition, in the presence of an amorphous phase such as glass, a halo peak is confirmed near 2θ=20° in XRD. The fact that no glass phase other than the above-mentioned two crystal phases is contained means that there is no halo peak having a peak intensity of more than 3 times the background intensity as described above.

<Evaluation>

For samples 1 and 2, the volume proportion (percent by volume) of the β-eucryptite crystal phase to the lithium tantalate crystal phase, average particle size of each of the crystal phases of β-eucryptite and lithium tantalate, bulk density, Young's modulus, specific rigidity, thermal conductivity, relative magnetic permeability, and coefficient of thermal expansion were measured. The measurement method is shown below, the measurement results of the coefficient of thermal expansion are shown in FIG. 1, and the other measurement results are shown in Table 1. In the following measurements, the cross section of the complex was mirror-finished by polishing with a 0.5 μm diamond paste.

(Volume Proportion)

The cross section of the complex was mirror-finished, and the cross section was observed with a reflected electron image at a magnification of 250 times using SEM. At this time, lithium tantalate and β-eucryptite were observed with different contrasts, so that both were distinguishable from each other. Then, the cross-sectional observation photograph was subjected to image analysis to determine their areas with respect to the area of the analyzing range, each of which was taken as a percent by volume.

(Average Particle Size)

The cross section of the complex was mirror-finished and then observed with a reflected electron image, and the average particle size was determined by image analysis of the observed image.

(Bulk Density)

Measured in accordance with JIS R 1634-1998.

(Young's Modulus)

The cross section of the mirror-finished complex was measured at 10 points at an indentation depth of 2000 nm by continuous rigid body measurement (CSM) using a Nano Indenter XP manufactured by MTS Systems Corporation, and the average value thereof was defined as Young's modulus.

(Specific Rigidity)

The specific rigidity was calculated by applying the measurement results of bulk density and Young's modulus to the formula: Young's modulus/bulk density.

(Thermal Conductivity)

Measured in accordance with JIS R 1611:2010.

(Relative Magnetic Permeability)

Sample size: 9 mm×9 mm×1.5 mm

Analyzer: Vibrating sample magnetometer "VSM-5" manufactured by Toei Industry Co., Ltd.

Measurement temperature: Room temperature (22° C.)

Magnetic field application direction: parallel to the surface

Magnetization range: 0.005 emu

Magnetic field range: 10 kOe

Magnetic field sweep: 1.4 kOe/min

Time constant: 0.3 sec (Coefficient of Thermal Expansion)

Measured in accordance with JIS R 1618:1994. For comparison, the coefficients of thermal expansion of β-eucryptite as sample 3 and lithium tantalate as sample 4 were also measured.

was set so that x would be the values shown in Table 2. x in Table 2 is a value measured on the obtained crystal powder of lithium tantalate by ICP emission spectroscopy.

The obtained lithium tantalate was subjected to heat treatment in coexistence with a mixture of potassium hydrogen carbonate and a powder of Ti and Fe as transition metal elements at 550° C. for 3 hours in a nitrogen atmosphere to thereby obtain lithium tantalate having a relative magnetic permeability of 1.00001. The potassium hydrogen carbonate and the transition metal element were mixed in a ratio such that the amount of the potassium hydrogen carbonate was 10 parts by mass with respect to 100 parts by mass of the lithium tantalate, and the amount of the transition metal element was 5 parts by mass with respect to 100 parts by mass of the potassium hydrogen carbonate.

A complex was prepared using the crystal of lithium tantalate obtained as described above. Specifically, crystals of β-eucryptite having an average particle size ($D_{50}$) of 0.9 μm and lithium tantalate were mixed to give a mixture. At this time, in the obtained complex, the crystals were mixed at a ratio such that the crystal phases of β-eucryptite and lithium tantalate each had the percent by volume shown in Table 2. Specifically, each crystal was mixed at the mixing ratio (mass ratio) shown in Table 2.

Then, the mixture was sintered to give complexes of Sample Nos. 1 to 43 shown in Table 2. The sintering conditions are as follows. Such sintering conditions caused grain growth in the crystals of β-eucryptite and lithium tantalate to the average particle size to be shown later. Here, a sample in which the same amount of glass (borosilicate glass) instead of lithium tantalate in Sample No. 7 shown in Table 2 was added, had a Young's modulus of 90 GPa and a specific rigidity of 36.

Sintering temperature: 1150° C.

Keep time: 3 hours

TABLE 1

|  | Mixing ratio (mass ratio) | | Volume ratio (% by volume) | | Average particle size (μm) | |
| --- | --- | --- | --- | --- | --- | --- |
|  | β-eucryptite | Lithium tantalate | β-eucryptite crystal phase | Lithium tantalate crystal phase | β-eucryptite crystal phase | Lithium tantalate crystal phase |
| Sample 1 | 93 | 7 | 97.5 | 2.5 | 4 | 2 |
| Sample 2 | 86.3 | 13.7 | 95.0 | 5.0 | 4 | 2 |

|  | Bulk density (g/cm³) | Young's modulus (GPa) | Specific rigidity | Thermal conductivity (W/mK) | Relative magnetic permeability |
| --- | --- | --- | --- | --- | --- |
| Sample 1 | 2.37 | 118 | 50 | 3 | 0.9999899 |
| Sample 2 | 2.38 | 118 | 50 | 3 | 0.9999895 |

[Sample Nos. 1 to 43]

<Preparation of Complex>

A complex different from samples 1 to 4 was prepared. When represented by the composition formula ($Li_{1-x}Ca_{x/2}$)$TaO_3$, crystals of lithium tantalate in which x had the values shown in Table 2 were prepared. Specifically, first, lithium carbonate, tantalum pentoxide, and calcium carbonate, having a purity of 99.9% by mass or more, were used to perform dry mixing and pulverization, and then heated and melted at 1670° C. in an iridium crucible to synthesize lithium tantalate. Then, the lithium tantalate was pulverized to obtain a crystal powder of lithium tantalate having an average particle size ($D_{50}$) of 1.5 μm. The ratio of calcium carbonate The obtained complex was measured by XRD. The XRD measurement conditions are as follows.

Analyzer: "X'Pert PRO-MRD" manufactured by PANalytical

Bulb: CuKα

Slit width: 0.5°

Measurement range: 2θ=10 to 80°

From the measurement results by XRD, the crystal phases of β-eucryptite and lithium tantalate were confirmed in the obtained complex. It was also confirmed that the complex did not contain a crystal phase or a glass phase other than the β-eucryptite crystal phase and the lithium tantalate crystal phase. The fact that no crystal phase other than the above-mentioned two crystal phases is contained means that when the diffraction peak having a peak intensity of more than 3 times the background intensity of XRD is set as a dominant peak, there is no peak except those of lithium tantalate and β-eucryptite. In addition, in the presence of an amorphous phase such as glass, a halo peak is confirmed near 2θ=20° in XRD. The fact that no glass phase other than the above-mentioned two crystal phases is contained means that there is no halo peak having a peak intensity of more than 3 times the background intensity as described above.

<Evaluation>

The following (1) to (10) were evaluated for Sample Nos. 1 to 43.

(1) Volume proportion of β-eucryptite crystal phase to lithium tantalate crystal phase (2) 2θ of diffraction peak of (006) plane in lithium tantalate crystal phase (3) Average particle size of crystal phase (4) Change width of coefficient of thermal expansion calculated for each 1° C. in evaluation temperature range (5) Coefficient of thermal expansion at 22° C.

(6) Bulk density (7) Young's modulus (8) Specific rigidity (9) Thermal conductivity

(10) Relative magnetic permeability

The measurement methods are shown below, and the measurement results except (3) are shown in Table 2. In the following measurements, the cross section of the complex was mirror-finished by polishing with a diamond paste having an average particle size of 0.5 μm.

(1) Volume Proportion of β-Eucryptite Crystal Phase to Lithium Tantalate Crystal Phase The cross section of the complex was mirror-finished, and the cross section was observed with a reflected electron image at a magnification of 250 times using SEM. At this time, lithium tantalate and β-eucryptite were observed with different contrasts, so that both were distinguishable from each other. Then, the cross-sectional observation photograph was subjected to image analysis to determine their areas with respect to the area of the analyzing range, each of which was taken as a percent by volume. Since the above-mentioned excess calcium component is in a very small amount (0.1% by volume or less), the total value of the β-eucryptite crystal phase and the lithium tantalate crystal phase is indicated as 100% by volume in Table 2.

(2) 2θ of Diffraction Peak of (006) Plane in Lithium Tantalate Crystal Phase

Determined from the above-mentioned measurement results by XRD.

(3) Average Particle Size of Crystal Phase

The cross section of the complex was mirror-finished and then observed with a reflected electron image, and the average particle size of each of the crystal phases of β-eucryptite and lithium tantalate was determined by image analysis of the observed image. In addition, the average particle size of the whole crystal phase was determined without distinguishing between those crystal phases. In each of the samples, the β-eucryptite crystal phase had an average particle size of 2 μm, the lithium tantalate crystal phase had an average particle size of 4 μm, and the combined crystal phase had an average particle size of 2 μm.

(4) Change Width of Coefficient of Thermal Expansion Calculated for Each 1° C. in Evaluation Temperature Range The coefficient of thermal expansion for each 1° C. from 0° C. to 50° C. was measured in accordance with JIS R 1618:1994. Then, the maximum and minimum values of the coefficient of thermal expansion in each of the evaluation temperature ranges of 15° C. to 40° C. and 0° C. to 50° C. were applied to the formula: maximum value-minimum value, and the change width of the coefficient of thermal expansion was calculated. In addition, the change in the coefficient of thermal expansion with respect to temperature was described. A monotonous increase means that the coefficient of thermal expansion increases as the temperature increases in the target temperature range. And, a monotonous decrease is vice versa. When the temperature dependence of the coefficient of thermal expansion is low, the opposite behavior may be exhibited in a narrow temperature range due to factors such as measurement error.

(5) Coefficient of Thermal Expansion at 22° C.

The coefficient of thermal expansion at 21.5 to 22.5° C. was measured in accordance with JIS R 1618:1994.

(6) Bulk Density

Measured in accordance with JIS R 1634:1998.

(7) Young's Modulus

The cross section of the mirror-finished complex was measured at 10 points at an indentation depth of 2000 nm by continuous rigid body measurement (CSM) using a Nano Indenter XP manufactured by MTS Systems Corporation, and the average value thereof was defined as Young's modulus.

(8) Specific Rigidity

The specific rigidity was calculated by applying the measurement results of bulk density and Young's modulus to the formula: Young's modulus/bulk density.

(9) Thermal Conductivity

Measured in accordance with JIS R 1611:2010.

(10) Relative Magnetic Permeability

Sample size: 9 mm×9 mm×1.5 mm

Analyzer: Vibrating sample magnetometer "VSM-5" manufactured by Toei Industry Co., Ltd.

Measurement temperature: Room temperature (22° C.)

Magnetic field application direction: parallel to the surface

Magnetization range: 0.005 emu

Magnetic field range: 10 kOe

Magnetic field sweep: 1.4 kOe/min

Time constant: 0.3 sec

TABLE 2

| Sample Nos. | Mixing Lithium tantalate X | Mixing Lithium tantalate Mixing ratio (mass ratio) | Mixing β-eucryptite Mixing ratio (mass ratio) | Volume ratio (% by volume) Lithium tantalate crystal phase | Volume ratio (% by volume) β-eucryptite crystal phase | (006) surface of Lithium tantalate crystal phase 2θ (deg.) | Complex Change with coefficient of thermal expansion in evaluation temperature range (ppb/K) 15° C.–40° C. | Complex Change with coefficient of thermal expansion in evaluation temperature range (ppb/K) 0° C.–50° C. | Coefficient of thermal expansion (ppb/K) 22° C. | Bulk density (g/cm³) | Young's modulus (GPa) | Specific rigidity | Thermal conductivity (W/mK) | Relative magnetic permeability |
|---|---|---|---|---|---|---|---|---|---|---|---|---|---|---|
| 1 | 0 | 3 | 97 | 1 | 99 | 39.18 | 400 | Monotonous increase | Monotonous increase | −50 | 2.39 | 118 | 49 | 3 | 0.9999899 |
| 2 | 0 | 6 | 94 | 2 | 98 | 39.18 | 398 | Monotonous increase | Monotonous increase | −26 | 2.39 | 118 | 49 | 3 | 0.9999900 |
| 3 | 0 | 7 | 93 | 2.5 | 97.5 | 39.18 | 401 | Monotonous increase | Monotonous increase | 10 | 2.37 | 118 | 50 | 3 | 0.9999888 |
| 4 | 0 | 9 | 91 | 3 | 97 | 39.18 | 399 | Monotonous increase | Monotonous increase | 30 | 2.38 | 121 | 51 | 3 | 0.9999900 |
| 5 | 0 | 14 | 86 | 5 | 95 | 39.18 | 402 | Monotonous increase | Monotonous increase | 49 | 2.38 | 121 | 51 | 3 | 0.9999890 |
| 6 | 0 | 26 | 74 | 10 | 90 | 39.18 | 505 | Monotonous increase | Monotonous increase | 994 | 2.39 | 122 | 51 | 3 | 0.9999913 |
| 7 | 0.05 | 2 | 98 | 0.5 | 89.5 | 39.25 | 50 | Monotonous increase | Monotonous increase | −421 | 2.39 | 118 | 49 | 3 | 0.9999900 |
| 8 | 0.05 | 3 | 97 | 1 | 99 | 39.25 | 50 | Monotonous increase | Monotonous increase | −48 | 2.39 | 118 | 50 | 3 | 0.9999878 |
| 9 | 0.05 | 6 | 94 | 2 | 98 | 39.25 | 49 | Monotonous increase | Monotonous increase | −23 | 2.39 | 120 | 50 | 3 | 0.9999890 |
| 10 | 0.05 | 7 | 93 | 2.5 | 97.5 | 39.25 | 48 | Monotonous increase | Monotonous increase | 8 | 2.40 | 120 | 50 | 3 | 0.9999890 |
| 11 | 0.05 | 9 | 91 | 3 | 97 | 39.25 | 79 | Monotonous increase | Monotonous increase | 25 | 2.41 | 120 | 50 | 3 | 0.9999910 |
| 12 | 0.05 | 14 | 86 | 5 | 95 | 39.25 | 81 | Monotonous increase | Monotonous increase | 47 | 2.42 | 121 | 50 | 3 | 0.9999809 |
| 13 | 0.05 | 26 | 74 | 10 | 90 | 39.25 | 80 | Monotonous increase | Monotonous increase | 989 | 2.45 | 122 | 50 | 3 | 0.9999898 |
| 14 | 0.08 | 2 | 98 | 0.5 | 99.5 | 39.30 | 81 | Monotonous increase | Monotonous increase | −417 | 2.39 | 118 | 49 | 3 | 0.9999880 |
| 15 | 0.08 | 3 | 97 | 1 | 99 | 39.30 | 46 | Monotonous increase | Monotonous increase | −45 | 2.39 | 118 | 50 | 3 | 0.9999900 |
| 16 | 0.08 | 6 | 94 | 2 | 98 | 39.30 | 59 | Monotonous increase | Monotonous increase | −20 | 2.39 | 118 | 49 | 3 | 0.9999899 |
| 17 | 0.08 | 7 | 93 | 2.5 | 97.5 | 39.30 | 51 | Monotonous increase | Monotonous increase | 7 | 2.41 | 120 | 50 | 3 | 0.9999898 |
| 18 | 0.08 | 9 | 91 | 3 | 97 | 38.30 | 49 | Monotonous increase | Monotonous increase | 20 | 2.41 | 121 | 50 | 3 | 0.9999897 |
| 19 | 0.08 | 14 | 86 | 5 | 95 | 39.30 | 50 | Monotonous increase | Monotonous increase | 39 | 2.42 | 121 | 50 | 3 | 0.9999879 |
| 20 | 0.08 | 26 | 74 | 10 | 90 | 39.30 | 45 | Monotonous increase | Monotonous increase | 992 | 2.45 | 122 | 50 | 3 | 0.9999910 |
| 21 | 0.1 | 2 | 98 | 0.5 | 99.5 | 39.33 | 44 | Monotonous increase | Monotonous increase | −422 | 2.39 | 118 | 49 | 3 | 0.9999888 |
| 22 | 0.1 | 3 | 97 | 1 | 99 | 39.33 | 44 | Monotonous increase is changed to monotonous decrease at room temperature | Monotonous increase is changed to monotonous decrease at room temperature | −48 | 2.39 | 118 | 49 | 3 | 0.9999899 |
| 23 | 0.1 | 6 | 94 | 2 | 98 | 39.33 | 52 | Monotonous increase is changed to monotonous decrease at room temperature | Monotonous increase is changed to monotonous decrease at room temperature | −21 | 2.40 | 119 | 50 | 3 | 0.9999877 |
| 24 | 0.1 | 7 | 93 | 2.5 | 97.5 | 39.33 | 22 | Monotonous increase is changed to monotonous decrease at room temperature | Monotonous increase is changed to monotonous decrease at room temperature | 2 | 2.41 | 120 | 50 | 3 | 0.9999990 |
| 25 | 0.1 | 9 | 91 | 3 | 97 | 39.33 | 11 | Monotonous increase is changed to monotonous decrease at room temperature | Monotonous increase is changed to monotonous decrease at room temperature | 17 | 2.41 | 120 | 50 | 3 | 0.9999799 |

TABLE 2-continued

| Sample Nos. | Mixing - Lithium tantalate Mixing ratio (mass ratio) | Mixing - β-eucryptite Mixing ratio (mass ratio) | X | Volume ratio (% by volume) Lithium tantalate crystal phase | Volume ratio (% by volume) β-eucryptite crystal phase | (006) surface of Lithium tantalate crystal phase 20 (deg.) | Complex - Change with coefficient of thermal expansion in evaluation temperature range (ppb/K) 15° C.~40° C. | Complex - Change with coefficient of thermal expansion in evaluation temperature range (ppb/K) 0° C.~50° C. | Coefficient of thermal expansion (ppb/K) 22° C. | Bulk density (g/cm³) | Young's modulus (GPa) | Specific rigidity | Thermal conductivity (W/mK) | Relative magnetic permeability |
|---|---|---|---|---|---|---|---|---|---|---|---|---|---|---|
| 26 | 14 | 86 | 0.1 | 5 | 95 | 39.33 | Monotonous increase is changed to monotonous decrease at room temperature | Monotonous increase is changed to monotonous decrease at room temperature | 20 | 2.42 | 121 | 50 | 3 | 0.9999904 |
| 27 | 26 | 74 | 0.1 | 10 | 90 | 39.33 | Monotonous increase is changed to monotonous decrease at room temperature | Monotonous increase is changed to monotonous decrease at room temperature | 22 | 2.45 | 122 | 50 | 3 | 0.9999899 |
| 28 | 2 | 98 | 0.15 | 0.5 | 99.5 | 39.33 | Monotonous increase | Monotonous increase | −425 | 2.39 | 117 | 49 | 3 | 0.9999901 |
| 29 | 3 | 97 | 0.15 | 1 | 99 | 39.33 | Monotonous increase | Monotonous increase | −50 | 2.39 | 118 | 49 | 3 | 0.9999889 |
| 30 | 6 | 94 | 0.15 | 2 | 98 | 39.33 | Monotonous increase | Monotonous increase | −23 | 2.40 | 118 | 49 | 3 | 0.9999798 |
| 31 | 7 | 93 | 0.15 | 2.5 | 97.5 | 39.33 | Monotonous increase | Monotonous increase | 9 | 2.41 | 119 | 49 | 3 | 0.9999887 |
| 32 | 9 | 91 | 0.15 | 3 | 97 | 39.33 | Monotonous increase | Monotonous increase | 30 | 2.42 | 118 | 49 | 3 | 0.9999699 |
| 33 | 14 | 86 | 0.15 | 5 | 95 | 39.33 | Monotonous increase | Monotonous increase | 49 | 2.43 | 121 | 49 | 3 | 0.9999888 |
| 34 | 26 | 74 | 0.15 | 10 | 90 | 39.33 | Monotonous increase | Monotonous increase | 991 | 2.45 | 123 | 49 | 3 | 0.9999896 |
| 35 | 2 | 98 | 0.2 | 0.5 | 99.5 | 39.33 | Monotonous increase | Monotonous increase | −430 | 2.39 | 118 | 49 | 3 | 0.9999902 |
| 36 | 3 | 97 | 0.2 | 1 | 99 | 39.33 | Monotonous increase | Monotonous increase | −49 | 2.40 | 118 | 49 | 3 | 0.9999899 |
| 37 | 6 | 94 | 0.2 | 2 | 98 | 39.33 | Monotonous increase | Monotonous increase | −25 | 2.41 | 119 | 49 | 3 | 0.9999895 |
| 38 | 7 | 93 | 0.2 | 2.5 | 97.5 | 39.33 | Monotonous increase | Monotonous increase | 10 | 2.42 | 120 | 50 | 3 | 0.9999798 |
| 39 | 9 | 91 | 0.2 | 3 | 97 | 39.33 | Monotonous increase | Monotonous increase | 32 | 2.42 | 120 | 50 | 3 | 0.9999798 |
| 40 | 14 | 86 | 0.2 | 5 | 95 | 39.33 | Monotonous increase | Monotonous increase | 48 | 2.43 | 122 | 50 | 3 | 0.9999809 |
| 41 | 26 | 74 | 0.2 | 10 | 90 | 39.33 | Monotonous increase | Monotonous increase | 994 | 2.45 | 123 | 50 | 3 | 0.9999960 |
| 42 | 19 | 81 | 0.05 | 11 | 89 | 39.33 | Monotonous increase | Monotonous increase | −438 | 2.39 | 119 | 50 | 3 | 0.999987 |
| 43 | 0.6 | 99.4 | 0.05 | 0.3 | 99.7 | 39.33 | Monotonous increase | Monotonous increase | 993 | 2.45 | 122 | 50 | 3 | 0.999967 |

[Sample Nos. 44 and 45]
<Preparation of Complex>
First, when represented by the composition formula $(Li_{1-x}Ca_{x/2})TaO_3$, crystals of lithium tantalate in which x had the values shown in Table 3 were prepared in the same manner as in Sample Nos. 1 to 43. Next, in the same manner as in Sample Nos. 1 to 43, except that the mixing ratio (mass ratio) was set to the ratio shown in Table 3, the crystals of β-eucryptite and lithium tantalate were mixed to give a mixture. Then, in the same manner as in Sample Nos. 1 to 43, except that the sintering temperature was set to the conditions shown in Table 3, the mixture was sintered, and complexes of Samples Nos. 44 and 45 shown in Table 3 were obtained.

The obtained complex was measured by XRD in the same manner as in Sample Nos. 1 to 43. As a result, the crystal phases of β-eucryptite and lithium tantalate were confirmed in the obtained complex. It was also confirmed that the complex did not contain a crystal phase or a glass phase other than the β-eucryptite crystal phase and the lithium tantalate crystal phase.

<Evaluation>
The following (1), (3), (11) and (12) were evaluated for Sample Nos. 44 and 45.
(1) Volume proportion of β-eucryptite crystal phase to lithium tantalate crystal phase
(3) Average particle size of crystal phase
(11) Bending strength
(12) Water absorption rate The measurement methods of (1) and (3) are the same as those for Sample Nos. 1 to 43. The measurement methods of (11) and (12) are shown below, and the measurement results are shown in Table 3. For comparison, (11) and (12) were also evaluated for Sample Nos. 10 and 38. The results are also shown in Table 3.
(11) Bending Strength
Measured in accordance with JIS 1601.
(12) Water Absorption Rate
Measured by the Archimedes method.

TABLE 3

| | Mixing | | Complex | | | | | | | |
|---|---|---|---|---|---|---|---|---|---|---|
| | Lithium tantalate | β-eucryptite | Volume ratio (% by volume) | | | Average particle size (μm) | | | | |
| Sample Nos. | x | Mixing ratio (mass ratio) | Mixing ration (mass ratio) | Lithium tantalate crystal phase | β-eucryptite crystal phase | Sintering temperature (° C.) | Lithium tantalate crystal phase | β-eucryptite crystal phase | As a Whole | Bending strength (MPa) | Water absorption rate (%) |
| 10 | 0.05 | 7 | 93 | 2.5 | 97.5 | 1150 | 4 | 2 | 2 | 160 | 0.04 |
| 44 | 0.05 | 7 | 93 | 2.5 | 97.5 | 1250 | 4 | 11 | 11 | 73 | 0.02 |
| 38 | 0.2 | 7 | 93 | 2.5 | 97.5 | 1150 | 4 | 2 | 2 | 163 | 0.03 |
| 45 | 0.2 | 7 | 93 | 2.5 | 97.5 | 1250 | 4 | 12 | 12 | 70 | 0.02 |

The invention claimed is:

1. A complex comprising
   a β-eucryptite crystal phase; and
   a lithium tantalate crystal phase.

2. The complex according to claim 1, wherein in a temperature range of 0 to 50° C., a coefficient of thermal expansion calculated for each 1° C. is within 0±1 ppm/K.

3. The complex according to claim 1, wherein the lithium tantalate crystal phase comprises calcium.

4. The complex according to claim 1, wherein a volume ratio of the β-eucryptite crystal phase to the lithium tantalate crystal phase is from 90:10 to 99.5:0.5.

5. The complex according to claim 1, wherein 2θ of a diffraction peak of a (006) plane in the lithium tantalate crystal phase is 39.25° or higher.

6. The complex according to claim 1, wherein in a temperature range of 15° C. to 40° C., a change width of a coefficient of thermal expansion calculated for each 1° C. is 50 ppb/K or less.

7. The complex according to claim 6, wherein in a temperature range of 0° C. to 50° C., a change width of a coefficient of thermal expansion calculated for each 1° C. is 100 ppb/K or less.

8. The complex according to claim 1, wherein a crystal phase having the β-eucryptite crystal phase and the lithium tantalate crystal phase combined has an average particle size of 2 μm or less.

9. The complex according to claim 1, having a relative magnetic permeability of 1 or less.

10. The complex according to claim 1, being used for an optical member.

11. The complex according to claim 1, having a bulk density of 3 g/cm$^3$ or less.

12. The complex according to claim 1, having a Young's modulus of 100 GPa or more.

13. The complex according to claim 1, wherein a percent by volume of the β-eucryptite crystal phase is larger than a percent by volume of the lithium tantalate crystal phase.

14. The complex according to claim 1, wherein a volume ratio of the β-eucryptite crystal phase to the lithium tantalate crystal phase is from 90:10 to 99:1.

15. The complex according to claim 1, being used for an optical member.

16. The complex according to claim 1, having a relative magnetic permeability of 1.001 or less.

17. The complex according to claim 1, wherein when the lithium tantalate is represented by a composition formula $(Li_{1-x}Ca_{x/2})TaO_3$, a relationship of $0<x\leq0.2$ is satisfied.

* * * * *